(12) United States Patent
Ye et al.

(10) Patent No.: US 10,541,315 B2
(45) Date of Patent: *Jan. 21, 2020

(54) INP-BASED TRANSISTOR FABRICATION (71) Applicants: Taiwan Semiconductor Manufacturing Company, Ltd., Hsinchu (TW); PURDUE RESEARCH FOUNDATION, West Lafayette, IN (US)

(72) Inventors: Peide Ye, West Lafayette, IN (US); Zhiyuan Cheng, Lincoln, MA (US); Yi Xuan, West Lafayette, IN (US); Yanqing Wu, West Lafayette, IN (US); Bunmi Adekore, Medford, MA (US); James Fiorenza, Wilmington, MA (US)

(73) Assignee: Purdue Research Foundation, West Lafayette, IN (US)

( * ) Notice: Subject to any disclaimer, the term of this patent is extended or adjusted under 35 U.S.C. 154(b) by 41 days.

This patent is subject to a terminal disclaimer.

(21) Appl. No.: 15/694,375

(22) Filed: Sep. 1, 2017

(65) Prior Publication Data

US 2018/0019320 A1    Jan. 18, 2018

Related U.S. Application Data

(60) Continuation of application No. 13/654,531, filed on Oct. 18, 2012, now Pat. No. 9,780,190, which is a
(Continued)

(51) Int. Cl.
*H01L 21/02* (2006.01)
*H01L 29/78* (2006.01)
(Continued)

(52) U.S. Cl.
CPC .. *H01L 29/66522* (2013.01); *H01L 21/02299* (2013.01); *H01L 21/02301* (2013.01);
(Continued)

(58) Field of Classification Search
CPC ......... H01L 29/66522; H01L 29/66462; H01L 29/66446; H01L 21/02543;
(Continued)

(56) References Cited

U.S. PATENT DOCUMENTS 5,036,374 A   7/1991   Shimbo
5,407,869 A   4/1995   Holloway et al.
(Continued)

FOREIGN PATENT DOCUMENTS

CN        104143760 A    11/2014

OTHER PUBLICATIONS

Hinkle, et al., "GaAs interfacial self-cleaning by atomic layer deposition." Appl. Phys. Lett. 92, 071901 2008.

*Primary Examiner* — Michael M Trinh
(74) *Attorney, Agent, or Firm* — Slater Matsil, LLP (57) ABSTRACT

Methods of forming structures that include InP-based materials, such as a transistor operating as an inversion-type, enhancement-mode device are disclosed. A dielectric layer may be deposited by ALD over a semiconductor layer including In and P. A channel layer may be formed above a buffer layer having a lattice constant similar to a lattice constant of InP, the buffer layer being formed over a substrate having a lattice constant different from a lattice constant of InP.

20 Claims, 8 Drawing Sheets

Related U.S. Application Data division of application No. 12/139,010, filed on Jun. 13, 2008, now Pat. No. 8,329,541.

(60) Provisional application No. 60/934,716, filed on Jun. 15, 2007.

(51) Int. Cl.
  *H01L 29/66* (2006.01)
  *H01L 29/51* (2006.01)
  *H01L 21/28* (2006.01)
  *H01L 29/778* (2006.01)

(52) U.S. Cl.
  CPC .. *H01L 21/02381* (2013.01); *H01L 21/02392* (2013.01); *H01L 21/02461* (2013.01); *H01L 21/02543* (2013.01); *H01L 21/28264* (2013.01); *H01L 29/517* (2013.01); *H01L 29/66446* (2013.01); *H01L 29/66462* (2013.01); *H01L 29/778* (2013.01)

(58) Field of Classification Search
  CPC ........... H01L 21/02461; H01L 21/0245; H01L 21/02639; H01L 21/02381; H01L 21/02392; H01L 21/02463; H01L 21/02466; H01L 21/02645; H01L 21/20546; H01L 21/02549; H01L 29/778
  See application file for complete search history.

(56) References Cited

U.S. PATENT DOCUMENTS

| | | |
|---|---|---|
| 5,616,947 A | 4/1997 | Tamura |
| 5,689,125 A | 11/1997 | Vaccaro et al. |
| 5,779,028 A | 7/1998 | De Vries |
| 5,986,291 A | 11/1999 | Currie et al. |
| 6,049,099 A | 4/2000 | Vaccaro et al. |
| 6,380,097 B1 | 4/2002 | Dauplaise et al. |
| 6,831,350 B1* | 12/2004 | Liu ..................... H01L 21/0237 257/241 |
| 7,626,246 B2 | 12/2009 | Lochtefeld et al. |
| 8,324,660 B2 | 12/2012 | Lochtefeld et al. |
| 8,329,541 B2* | 12/2012 | Ye ..................... H01L 29/66462 438/285 |
| 8,524,562 B2 | 9/2013 | Wang et al. |
| 2001/0021539 A1 | 9/2001 | Akane et al. |
| 2002/0068458 A1 | 6/2002 | Chiang et al. |
| 2004/0067660 A1 | 4/2004 | Wilk et al. |
| 2004/0256613 A1* | 12/2004 | Oda ................ H01L 21/823807 257/19 |
| 2005/0040473 A1 | 3/2005 | Saito |
| 2005/0073028 A1* | 4/2005 | Grant ................ H01L 21/76262 257/617 |
| 2005/0110082 A1 | 5/2005 | Cheng et al. |
| 2006/0057800 A1 | 3/2006 | Doan et al. |
| 2006/0113605 A1 | 6/2006 | Currie |
| 2006/0292719 A1* | 12/2006 | Lochtefeld ........ H01L 21/02381 438/22 |
| 2007/0102732 A1 | 5/2007 | Lee et al. |
| 2007/0132034 A1 | 6/2007 | Curello et al. |
| 2007/0138565 A1 | 6/2007 | Suman et al. |
| 2007/0181977 A1* | 8/2007 | Lochtefeld ...... H01L 21/823807 257/618 |
| 2007/0262363 A1 | 11/2007 | Tao et al. |
| 2007/0284613 A1 | 12/2007 | Chui et al. |
| 2007/0284629 A1 | 12/2007 | Marks et al. |
| 2008/0048216 A1 | 2/2008 | Ye et al. |
| 2008/0073641 A1* | 3/2008 | Cheng ................... B82Y 10/00 257/25 |
| 2008/0073667 A1* | 3/2008 | Lochtefeld ........ H01L 29/66795 257/190 |
| 2008/0093622 A1* | 4/2008 | Li ..................... H01L 21/02381 257/103 |
| 2009/0289280 A1 | 11/2009 | Zhang et al. |
| 2010/0065824 A1 | 3/2010 | Wang et al. |
| 2010/0283083 A1 | 11/2010 | Niiyama et al. |

* cited by examiner

- SURFACE CLEAN AND PRETREATMENT $(NH_4)_2S$
- DEPOSITION OF 30 nm $Al_2O_3$ USING ALD
- ION IMPLANTATION (Si 35Kev, $1 \times 10^{14}/cm^2$)
- ACTIVATION USING RTA 720 °C FOR 10 sec
- FOR REGROWN OXIDE, ETCH AWAY OXIDE USING BHF AND REGROW 8 nm $Al_2O_3$ OR $HfO_2$ OR HfAlO AND PDA
- S/D REGION PATTERNING AND METAL DEPOSITION AuGe/Ni/Au AND RTA
- GATE REGION PATTERNING AND METAL DEPOSITION Ni/Au

INP-BASED TRANSISTOR FABRICATION

PRIORITY CLAIM AND CROSS-REFERENCE

This application is a continuation of U.S. patent application No. 13/654,531, filed Oct. 18, 2012, entitled "InP-Based Transistor Fabrication," now U.S. Pat. No. 9,780,190, issued on Oct. 3, 2017, which is a divisional of U.S. patent application Ser. No. 12/139,010, filed Jun. 13, 2008, entitled "InP-Based Transistor Fabrication," now U.S. Pat. No. 8,329,541 issued on Dec. 11, 2012, which claims the benefit of and priority to U.S. Provisional Application No. 60/934,716, filed Jun. 15, 2007, the entire disclosures of these applications are incorporated by reference herein in their entireties.

JOINT RESEARCH AGREEMENT DISCLOSURE

Subject matter disclosed herein was made pursuant to a joint research agreement between AmberWave Systems Corporation and Purdue University.

TECHNICAL FIELD

The technology disclosed herein relates generally to semiconductor structures and methods of making semiconductor structures and more specifically to use of alternatives to Si for constructing transistors using InP-based materials.

BACKGROUND

The increasing operating speeds and miniaturization of semiconductor devices have given rise to a need to find alternatives to silicon for the source, drain, and channel regions of transistors and to $SiO_2$ for the gate dielectric of FET transistors. Research has been performed on compound semiconductors such as GaAs and other III-V materials for high-performance transistor applications. Although there have been successful demonstrations of depletion-mode GaAs metal-oxide-semiconductor field-effect transistors (MOSFETs), inversion-type enhancement-mode GaAs MOSFETs have suffered from problems such as relatively low drain currents. Notwithstanding research and development efforts by many institutions into aspects of III-V materials, there remains a need for commercially viable techniques for providing improved performance using materials such as InP.

SUMMARY

According to aspects of embodiments of the invention described below, atomic layer deposition (ALD) techniques with high-k gate dielectrics are used to provide inversion-type enhancement-mode InP-based MOSFETs that demonstrate substantial technological improvements. For example, drain currents for InP devices described below may have drain currents more than 1,000 times greater than drain currents for existing enhancement-mode GaAs MOSFETs. Other aspects include improved performance with respect to Fermi level pinning and higher electron saturation velocity ($2\times10^7$ cm/s). At equivalent gate lengths, aspects of the embodiments described below can provide high-field transconductance greatly improved (>50% higher) in comparison to devices having equivalent channel lengths and fabricated with more conventional semiconductors such as Si, Ge, or GaAs. The ALD high-k/InP-based material system mitigates problems associated with Fermi-level pinning reported in the literature.

Provision of high-performance InP-based MOSFETs may enable a new generation of high-frequency transistors because of the intrinsically higher and robust charge-transport properties of InP-based materials relative to other semiconducting materials. The presence of a gate dielectric in MOSFET structures reduces overall device leakage and enhances both control and responsivity of channel regions. The need for gate dielectric materials suitable for use with InP, and methods for formation thereof, has hitherto limited the commercialization of InP-based MOSFETS. Previous efforts focused on the deposition of dielectric materials on InP have resulted in various difficulties including interfacial chemical instabilities, electronic instabilities such as Fermi-energy pinning, and device fabrication difficulties involving high series-resistance source and drain terminals. Embodiments of the present invention provide techniques enable the fabrication of commercially viable InP-based MOSFETs, a long-sought but yet-to-be achieved goal.

In an aspect, an embodiment of the invention includes a method of fabricating a transistor. An InP-based material layer structure including a channel layer is provided. A source region and a drain region are defined in the InP-based material layer structure. A channel region is provided between the source and drain regions, the channel region including at least a portion of the channel layer. A gate dielectric is deposited over the channel region by atomic layer deposition (ALD). A gate is provided above the channel region. At least a portion of the gate dielectric may be disposed between the gate and the channel region, and the transistor may operate as an inversion-type, enhancement-mode device.

One or more of the following features may be included. The source and drain regions are at least partially disposed in the channel layer. The source and drain regions are disposed above the channel layer. The gate dielectric comprises at least one of a group II material and/or a transition metal, e.g., includes at least one of aluminum, $Al_2O_3$, hafnium, and/or HfO. The channel layer may include a strained region. The channel layer may include at least one of InSb, InGaAs, InAs, and/or InP. The channel layer may include a plurality of substantially lattice-matched layers.

The transistor may be, e.g., a MOSFET or a HEMT. The InP-based material layer may be provided over a silicon substrate.

In another aspect, an embodiment of the invention includes a method of fabricating a transistor. An InP-based material layer including a channel layer is provided. A source region and a drain region are defined in the InP-based material layer. A channel region is provided between the source and drain regions, the channel region including at least a portion of the channel layer. A gate dielectric is formed over the channel region, the gate dielectric including at least one of a group II material or a transition metal. A gate is provided above the channel region. At least a portion of the gate dielectric may be disposed between the gate and the channel region, and the transistor may operate as an inversion-type, enhancement-mode device.

One or more of the following features may be included. The gate dielectric may include aluminum and/or hafnium. The gate dielectric is formed by ALD.

In still another aspect, an embodiment of the invention includes a method of fabricating a semiconductor structure. A semiconductor layer comprising indium and phosphorous is provided. A dielectric layer comprising hafnium is deposited by ALD above at least a portion of the semiconductor layer. A conductive layer is provided over at least a portion of the dielectric layer. The dielectric layer is disposed between the semiconductor layer and the conductive layer.

One or more of the following features may be included. The semiconductor layer includes a transistor channel region and the conductive layer including a transistor gate region. The dielectric layer may include at least one of oxygen, silicon, and/or nitrogen. The semiconductor layer is provided over a substrate that includes silicon.

In another aspect, an embodiment of the invention includes a semiconductor structure. The structure includes a silicon substrate. An InP-based material layer structure including a channel layer is disposed above the substrate. A transistor including a source region, a drain region, and an inversion-type channel region may be disposed at least partially within the channel layer, and a gate region is disposed above the channel region.

One or more of the following features may be included. A mask layer is disposed above the substrate and includes a plurality of openings; a second layer of material having a lattice-mismatch with silicon is disposed within the openings. The second layer may include indium and phosphorous.

A dielectric layer is disposed between the channel region and the gate region, the dielectric layer including at least one of aluminum and/or hafnium. The channel layer includes a strained region. The channel layer includes at least one of InSb, InGaAs, InAs, and/or InP. The channel layer includes a plurality of substantially lattice-matched layers.

In still another aspect, an embodiment of the invention includes a method of making a semiconductor structure. A substrate including a top layer having a compound comprising indium and a second element is provided. A dielectric layer is provided over the top layer, a region of the dielectric layer adjacent the top layer being substantially non-reactive with indium and the second element and configured to suppress out diffusion of dopants from the top layer during a thermal anneal step. A dopant species is implanted into the top layer. The top layer is thermally annealed to activate the dopant at a relatively high temperature.

One or more of the following features may be included. The second element is phosphorous, antimony, aluminum, gallium, and/or arsenic. Implanting a dopant species into the top layer includes implanting the dopant species through the dielectric layer. The dielectric layer includes first and second layers, the first layer being adjacent the top layer and substantially non-reactive with indium and the second element, the first layer having a first composition and the second layer having a second composition different from the first composition. The second layer includes oxygen, aluminum, and/or hafnium. The substrate includes a bottom portion including silicon.

In another aspect, an embodiment of the invention includes a method of forming a transistor. The method includes providing a substrate including a top layer disposed thereover, the top layer including a compound comprising indium and a second element. A dielectric layer is deposited above the top substrate layer by atomic layer deposition. A mask layer may be disposed above the dielectric layer to define a gate region, a source region, and a drain region of a transistor. A dopant is implanted through the dielectric layer into the source region and the drain region proximate the gate region, the mask layer blocking implantation of the dopant into the gate region. A high temperature anneal is performed to activate the dopant in the source and drain regions.

One or more of the following features may be included. The substrate includes a bottom portion including silicon. Implanting a dopant through the dielectric layer to define the source and drain regions substantially amorphizes the source and drain regions. The high temperature anneal recrystallizes the source and drain regions. A portion of the mask layer is replaced with a gate structure without lithography so that the gate structure is aligned to the source and drain regions. A substantially lattice-matched layer is provided atop the substrate in which the source and drain regions are formed. The layer may include at least one of InSb, InGaAs, InAs, and/or InP; the layer may include a plurality of substantially lattice-matched layers.

In another aspect, an embodiment of the invention includes a method of forming a transistor. A substrate including indium and phosphorous is provided. A mask layer is disposed above the substrate to define a gate region of a transistor. A dopant is implanted to create source and drain regions, with the mask layer blocking implantation of the dopant into the gate region. A portion of the mask layer is replaced with a gate structure without lithography so that the gate structure is aligned to the source and drain regions.

One or more of the following features may be included. The substrate includes a bottom portion including silicon. Implanting a dopant substantially amorphizes the source and drain regions. A high temperature anneal is performed to activate the dopant and to recrystallize the source and drain regions.

A high temperature anneal is performed to activate the dopant in the source and drain regions. The gate structure includes a dielectric layer created after performing a high temperature anneal to activate the dopant.

In yet another aspect, an embodiment of the invention includes a method of forming a transistor. A substrate comprising indium and phosphorous is provided. A mask is provided above the substrate to define source, drain, and gate regions of a transistor. A dopant is implanted into the source and drain regions. At least a portion of the source and drain regions is amorphized. An anneal is performed to recrystallize the amorphized portions of the source and drain regions.

One or more of the following features may be included. The substrate includes a bottom portion comprising silicon. The substrate includes a top layer comprising indium and phosphorous, InP, InSb, InGaAs and/or InAs. A barrier layer in contact with a top portion of the substrate is provided. A region of the barrier layer in contact with the top portion of the substrate is substantially free of oxygen and/or includes nitrogen. The barrier layer includes at least one of AlN, TaN, and/or TiN.

The barrier layer includes a dielectric layer relatively inert to the top portion and the dielectric layer is formed by atomic layer deposition. A second dielectric layer is provided above the dielectric layer, with the second dielectric layer being not inert to the top portion of the substrate.

The barrier layer is oxidized to improve a dielectric property of the barrier layer. The steps of implanting and amorphizing include a single step of implanting a dopant that amorphizes at least a portion of the source and drain regions. The dopant includes SiX, with X including a group VIIA element. Ohmic contacts adjacent the source and drain regions are defined.

In still another aspect, an embodiment of the invention includes forming a transistor. A substrate including indium and phosphorous is provided. A mask layer may be formed above the substrate to define a source region, a drain region, and a gate region of a transistor. A dopant is implanted into the source and drain regions, the mask layer blocking implantation of the dopant into the gate region. The mask layer is removed to expose the gate region. At least a portion of a channel layer is epitaxially grown.

One or more of the following features may be included. The portion of the channel layer is epitaxially grown by ALD, MBE, or CVD. Epitaxially growing at least a portion of the channel layer includes growing one or more of InSb, InGaAs, InAs, and/or InP. The gate channel includes indium and phosphorous; indium and antimony; indium and arsenic; and/or gallium and arsenic.

The substrate includes a top surface prior to the step of forming the mask layer, the gate channel layer includes a top surface, and the top surface of the gate channel layer is disposed above the top surface of the substrate. The substrate includes a top surface prior to the step of forming the mask layer, the gate channel layer includes a bottom surface, and the bottom surface of the gate channel layer is disposed below the top surface of the substrate.

In yet another aspect, an embodiment of the invention includes a method of forming a transistor. The method includes providing a substrate including indium and phosphorous. A mask layer may be disposed above the substrate to define source, drain, gate, and gate channel regions of a transistor. A first dopant type is provided in the gate channel region. A portion of the substrate in the source and drain regions may be removed to form source and drain recesses. The source and drain recesses are filled with a semiconductor material having a second dopant type different from the first dopant type.

One or more of the following features may be included. The second dopant type is opposite from the first dopant type. Filling the source and drain recesses includes an epitaxial growth technique, e.g., at least one of MBE, ALD, and CVD. Filling the source and drain recesses includes filling the source and drain recesses with a material having a lattice constant different from a lattice constant of the substrate and the material induces stress in the channel region. The semiconductor material includes at least one of GaAs, InGaAs, In-rich InGaAs, or InP.

In another aspect, an embodiment of the invention includes a method of fabricating a transistor. A crystalline substrate having a first lattice constant substantially different from a lattice constant of InP is provided. A non-crystalline mask is provided above the substrate, the mask including an opening having sidewalls that extend above the substrate by a height. A crystalline buffer layer having a second lattice constant substantially similar to the lattice constant of InP may be provided within the opening. The buffer layer may have a height less than the mask opening sidewall height, the buffer layer height being sufficient to permit defects arising from the lattice mismatch to exit the buffer layer at the mask opening sidewalls. A channel layer is provided above the buffer layer, the channel layer being substantially lattice-matched with the buffer layer. A source region, a drain region, and a channel region of a transistor are defined in the channel layer. A gate is provided above the channel layer.

One or more of the following features may be included. The substrate is a silicon substrate. The mask includes $SiO_2$. The buffer layer includes a III-V material. e.g., InP. The channel layer includes at least one of InP, InSb, InGaAs, InAs, and/or InP. The channel layer is disposed within the mask opening. The channel layer is disposed substantially completely above the mask. The transistor is an inversion-type, enhancement-mode transistor.

In another aspect, an embodiment of the invention includes a method of processing a semiconductor structure. A substrate comprising indium and phosphorous is provided. Oxide from a top surface of the substrate is removed using at least one of HF, HCl, and $NH_4OH$. The top surface is passivated using at least one of an $(NH_4)_2S$ or an OH-group compound.

The removing and passivating steps may be performed in situ or performed ex situ.

In another aspect, a method includes forming a mask layer over a substrate. The substrate includes a first crystalline semiconductor material having a first lattice constant. The mask layer includes a non-crystalline dielectric material. The mask layer is patterned to form an opening in the mask layer. The opening exposes a portion of the substrate. A buffer layer is formed in the opening. The buffer layer includes a second crystalline semiconductor material having a second lattice constant. The second lattice constant is different from the first lattice constant. A topmost surface of the buffer layer is below a topmost surface of the mask layer. Dislocation defects within the buffer layer extend laterally and terminate at a sidewall of the opening. A semiconductor layer is formed over the buffer layer in the opening. The semiconductor layer includes a third crystalline semiconductor material having a third lattice constant. The third lattice constant is substantially same as the second lattice constant. A gate stack is formed over the semiconductor layer.

In another aspect, a method includes forming a mask layer over a substrate. The substrate includes a first crystalline semiconductor material having a first lattice constant. The mask layer includes a non-crystalline dielectric material. The mask layer is patterned to form an opening in the mask layer. The opening exposes a surface of the substrate. A semiconductor layer is epitaxially grown over the mask layer and in the opening. The semiconductor layer includes a second crystalline semiconductor material having a second lattice constant. The second lattice constant is different from the first lattice constant. Dislocation defects within the semiconductor layer extend laterally and terminate at a sidewall of the opening. A gate stack is formed over the semiconductor layer.

In another aspect, a method includes forming a non-crystalline dielectric layer over a substrate. The substrate includes a first crystalline semiconductor material having a first lattice constant. The non-crystalline dielectric layer is etched to form an opening in the non-crystalline dielectric layer. The opening exposes a portion of the substrate. The opening has a first width and a first height. A buffer layer is epitaxially grown in the opening. The buffer layer includes a second crystalline semiconductor material having a second lattice constant. The second lattice constant is different from the first lattice constant. The buffer layer has a second height less than the first height. Dislocation defects within the buffer layer extend laterally and terminate at a sidewall of the opening below a third height. The third height is less than the second height. The third height is between one half of the first width and two times the first width. A semiconductor layer is epitaxially grown over the buffer layer in the opening. The semiconductor layer includes a third crystalline semiconductor material having a third lattice constant. The third lattice constant is substantially same as the second lattice constant. A gate dielectric is formed over the semiconductor layer. A gate electrode is formed over the gate dielectric.

DETAILED DESCRIPTION

Aspects of this invention address, among other things, the challenges of forming a high-quality interface between a gate dielectric and InP and other InP-based materials through the use of ALD. See also Y. Q. Wu, et al., "Inversion-type enhancement-mode InP MOSFETs with ALD $Al_2O_3$, $HfO_2$ and HfAlO nanolaminates as high-k gate dielectrics." *Proceedings of 65th Device Research Conference*, Notre Dame, USA (2007) and Y. Q. Wu, et al., "Enhancement-mode InP n-channel metal-oxide-semiconductor field-effect-transistors with atomic-layer-deposited $Al_2O_3$ dielectrics." *Applied Physics Letters* 91, 022108-022110 (2007), incorporated by reference herein in their entireties.

Figure 1A:
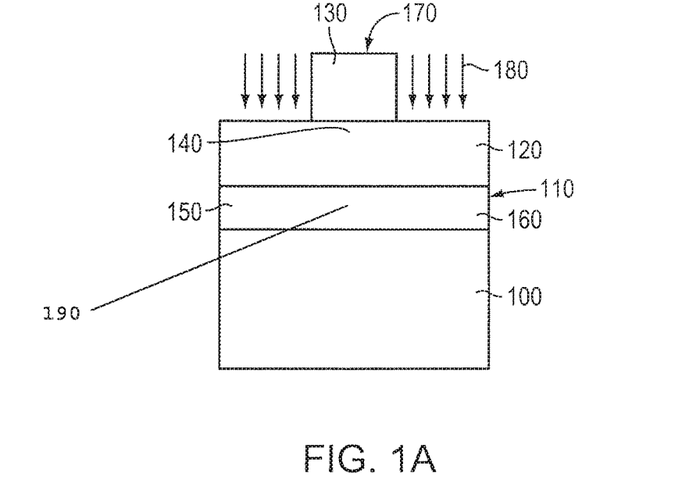
FIGS. 1A and 1B are schematic cross-sectional views illustrating an embodiment of the invention including the implantation and anneal of source and drain regions through a layer that is subsequently removed.

Referring to FIG. 1A, a semiconductor substrate 100 has an InP-based top layer 110 disposed thereover. In various embodiments, a portion of this InP layer may be used to form a channel for a transistor. The substrate 100 may include a semiconductor material and may be, for example, a bulk silicon wafer, a bulk germanium wafer, a semiconductor-on-insulator (SOI) substrate, or a strained semiconductor-on-insulator (SSOI) substrate. The substrate 100 may include or consist essentially of a first semiconductor material, such as a group IV element. e.g., germanium or silicon. In an embodiment, the substrate 100 includes or consists essentially of (100) silicon. In some embodiments, the substrate 100 is an InP substrate, with a top region of the InP substrate defining the InP-based top layer 110.

The InP-based top layer 110 may be formed by molecular beam epitaxy (MBE), a chemical vapor deposition (CVD) process, e.g., metalorganic CVD (MOCVD), or other deposition techniques on the substrate 100. In an embodiment in which the InP-based top layer 11μ0 is InP disposed over an InP substrate, the top layer may have a thickness ranging from, e.g., 1 nm to 100 μm. In an embodiment, the composition and lattice constant of the InP-based top layer 110 is different from the composition and lattice constant of the substrate 100. In a preferred embodiment, the thickness of the InP-based top layer 110 is below its critical thickness and the InP-based top layer 110, i.e., the channel layer, may include a strained region. For example, with a lattice-mismatch of 5%, the critical thickness is about 15 nm, and the InP-based top layer 110 preferably has a thickness less than 15 nm. In other embodiments, the thickness of the InP-based top layer 110 is greater than the critical thickness and the layer is at least partially relaxed. In an embodiment, the InP-based top layer 110 is relaxed.

In alternative embodiments, one or more layers of materials that are substantially lattice-matched to InP, such as InAlAs or InGaAs, or thin layers of non-lattice-matched III-V compounds, such as GaAs, InSb or InAs, are provided above the InP-based top layer 110 for use in forming transistor source, drain, and/or channel regions. Such thin layers of non-lattice-matched III-V compounds may be strained, which may result in enhanced performance characteristics such as improved electron and/or hole mobility. As used herein, "substantially lattice-matched to InP" means having a lattice constant difference with a lattice constant of InP of no greater than about 10%, preferably no greater than about 5%. To maintain strain in non-lattice-matched III-V compounds, such as GaAs. InSb. and InAs, the thickness of such layers is preferably less than about 10 nm.

As used herein, the term "InP-based materials" is used to refer to compositions that include or consist essentially of InP and may include additional elements. As used herein, "InP-based material layer structure" is used to refer to an InP layer or InP-based layer alone or in combination with one or more layers that are substantially lattice matched to InP or in combination with thin, strained, non-lattice-matched III-V layers.

To prevent damage to the top layer during ion implantation, such as when creating transistor source and drain regions, an encapsulation protection layer 120, i.e., a dielectric layer, is disposed on the top surface of the InP-based top layer 110. This protection layer allows implantation therethrough while preventing damage of the InP-based top layer. Examples of a suitable protection layer include a $SiO_2$ or SiN layer deposited by a CVD process, e.g., MOCVD, or an $Al_2O_2$ layer or a nanolaminate layer, including a material such as $HfO_2$ and/or HfAlO, deposited by ALD. A mask 130 is formed above the protection layer, and used to define a gate region 140, a source region 150 and a drain region 160 for a transistor. The mask forms a dummy gate structure 170, which serves as a hard mask for a subsequent ion implantation step. The mask may be formed from a suitable masking material, such as a dielectric material. e.g., $Si_3N_4$, in accordance with methods known to one of skill in the art.

The source and drain regions 150, 160 are defined in the InP-based top layer by performing an appropriate source/drain dopant ion implantation 180, using conventional techniques known to those of skill in the art, taking into account the composition of the protection layer. A channel region 190 is provided between the source and drain regions and includes at least a portion of the InP-based top layer 110, i.e., the channel layer. An anneal is then performed at a suitably high temperature to activate the implanted dopant, for example between about 600° C. and 900° C. with rapid thermal processing ("RTP"). The encapsulation protection layer protects the InP-based material surface during the implantation and anneal processes.

Figure 1B:
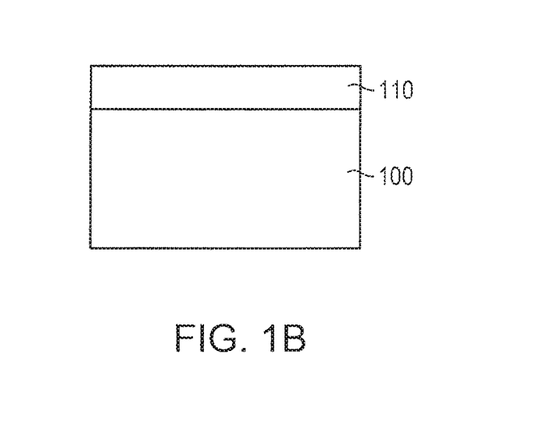

The encapsulation protection layer and the dummy gate structure may be removed after the implantation and anneal steps to create a device-ready InP-based top layer 110 as shown in FIG. 1B. Optionally, to improve the surface quality of the InP-based top layer prior to device fabrication, a portion of its top surface may be removed to ensure the elimination of any portion that is or may be damaged. Another optional method to improve the quality of the InP-based top layer 110 is to provide an additional protective/sacrificial cap layer (not shown) on the top surface InP-based top layer 110 before forming the protection layer 120, for example, a passivation layer including one or more materials such as S, $NH_4OH$, amorphous Si, and/or amorphous Ge.

Subsequently, the surface of the InP-based top layer 110 is cleaned, and a high-quality gate dielectric layer (not shown) is deposited by, e.g., an ALD process in, for example, an ASC F-120 ALD reactor. The gate dielectric layer may be a high-k dielectric. Exemplary gate dielectric structures include, for example, a layer of $Al_2O_3$, a layer of $HfO_2$ layer, a nanolaminate layer of $HfO_2$ and $Al_2O_3$, or HfAlO, or any other suitable gate dielectric material. A post-deposition anneal (PDA) may be performed using $O_2$, $N_2$, or any other suitable ambient at an appropriate temperature, for example between about 400° C. and 700° C.

A gate (not shown) is formed above the channel region. At least a portion of the gate dielectric is disposed between the gate and the channel region, and the transistor operates as an inversion-type enhancement-mode device, i.e., a device that is off at a gate voltage $V_g=0$, and is on at $V_g>0$. As is known to those skilled in the art, there has been a long-time standing Fermi-level pinning issue in fabricating III-V compound semiconductor MOSFET devices. As discussed in the context of FIGS. 2A-2J, this issue is addressed in embodiments of the instant invention.

Figure 2A:
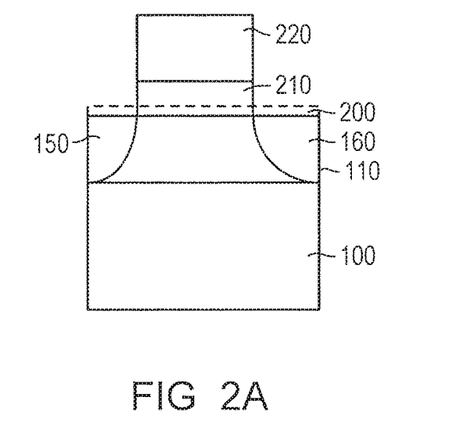
FIGS. 2A-2J are schematic cross-sectional views of enhancement-mode InP MOSFETs fabricate in accordance with embodiments of the invention, and charts describing experimental procedures and data obtained for enhancement-mode InP MOSFETs.
Figure 2B:
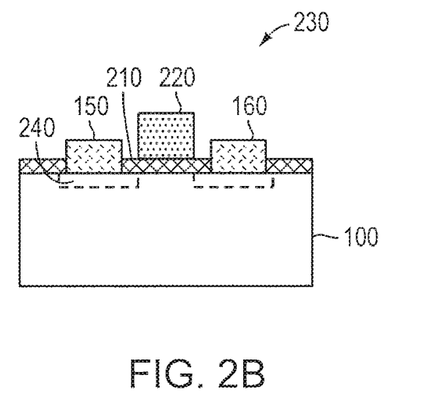

FIGS. 2A and 2B illustrate examples of InP MOSFETs. An InP MOSFET 200 may be formed as follows. First, an appropriately doped or semi-insulating semiconductor substrate with an InP-based channel layer is provided, i.e., an InP-based layer 110, over a substrate 100. Optionally, an additional epitaxial layer 200 may be deposited above the InP channel layer as described above for FIGS. 1A and 1B, e.g., by CVD, MOCVD or MBE. This additional epitaxial layer 200 may be InP and may include multiple layers of a material other than InP, such as InSb, InAs, GaAs, InAlAs, and/or InGaAs that may be substantially lattice-mismatched to InP. In order to maintain strain in the epitaxial layer 200, its thickness may be below the critical thickness.

An appropriate source and drain ion implantation is performed to create source and drain regions 150, 160 that have a conduction type opposite to that of the channel region, i.e., with n-type source and drain for a p-type channel (for an n-type inversion-type MOSFET), or with p-type source and drain for an n-type channel (for a p-type inversion-type MOSFET). For example, an appropriate p-type source and drain implantation may be a Group II element such as Mg, Be, etc., with a dosage ranging from, e.g., $4 \times 10^{17}/cm^3$ to $1 \times 10^{19}/cm^3$, with an implantation depth of, e.g., 1 nm to 1 µm. An appropriate n-type source and drain implantation may be a Group IV element, e.g., Si, Ge, etc. with a dosage ranging from, e.g., $4 \times 10^{17}/cm^3$ to $1 \times 10^{19}/cm^3$, with an implantation depth of, e.g., 1 nm to 1 µm. A target for both n-type and p-type source and drain implantations is to achieve dosage levels as high as are typically attained in Si devices. This may be a challenge in InP-based materials because n-type dopants in a III-V material may exhibit p-type behavior above a certain concentration. For example, n-type dopant Si, when present in a concentration greater than about $1 \times 10^{19}/cm^3$ in InP, exhibits p-type behavior. A high-quality gate dielectric 210 is formed, typically by first performing a surface-preparation step including a liquid-phase pretreatment or a gas-phase pretreatment employing, e.g., $(NH_4)_2S$ or $(NH_4)OH$, followed by surface treatment with hydrogen or nitrogen plasma, either in-situ in the same chamber, if feasible, or ex-situ. Preferably an ALD process is used to deposit a high-k dielectric layer. The gate dielectric layer may be an $Al_2O_3$ layer, an $HfO_2$ layer, a nanolaminate layer of $HfO_2$ and HfAlO, a group-II oxide, or any other dielectric material such as a rare-earth oxide or metallic oxide. The gate dielectric layer may have a thickness selected from a range of 1 nm to 1000 nm, preferably 1 nm-10 nm. The gate 220 is defined by conventional gate electrode deposition and lithographic patterning. Subsequently, source and drain ohmic contacts are formed.

FIG. 2B illustrates the structure of a prototype inversion-type InP MOSFET 230, integrated with a high-k dielectric deposited by ALD. The substrate 100 may be an InP semi-insulating substrate. The source and drain regions 150, 160 are defined over a Si implanted n+ region 240. The gate dielectric 210 may be formed from a high-k dielectric, such as $Al_2O_3$, $HfO_2$, or HfAlO, and/or combinations thereof. The gate 220 is formed from a suitable conducting material, such as nickel/gold.

The InP MOSFET 230 operates as an inversion-type, enhancement mode device. Because the source and drain regions are of a doping type opposite to that of the channel, e.g., n-type source and drain regions and a p-type channel, at a gate voltage $V_g=0$, the device is off, such that no current flows between the source and drain.

Figure 2C:
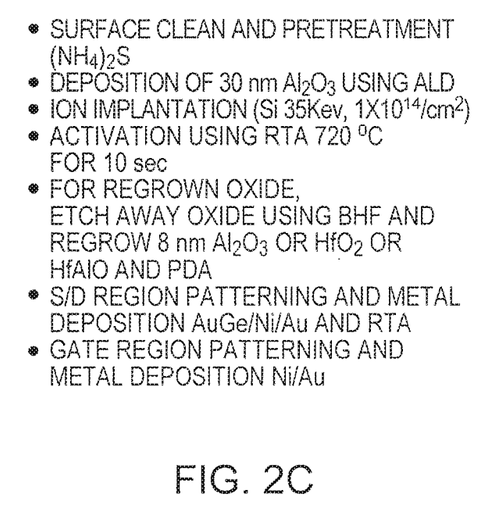

FIG. 2C summarizes the key steps for the fabrication of $Al_2O_3$/InP MOSFETs by use of ALD on an InP semi-insulating substrate, as illustrated in FIG. 2B. Prior to the formation of the high-k gate dielectric 210, surface cleaning and preparation of the substrate 100 includes HF- or HCl-based native oxide removal, $NH_4OH$-based native oxide cleaning and OH-group passivation, and $(NH_4)_2S$ based sulfur passivation. These ex-situ wet-cleaning process steps may be extended to an in-situ gap-phase dry-cleaning process that comprises HF or HCl gas-phase cleaning, $NH_4OH$ gas-phase cleaning, and $(NH_4)_2S$ gas-phase passivation. Additionally, acetone, methanol, and iso-proponal cleaning may be performed.

After surface degreasing and $(NH_4)_2S$-based pretreatment, the substrate is transferred in a room ambient to an ALD reactor, such as an ASM F-120 ALD reactor, for gate dielectric 210 formation. The gate dielectric 210 may be, for example, an $Al_2O_3$ layer having a thickness of, e.g., 30 nm, deposited at a substrate temperature of 300° C. using alternately pulsed chemical precursors of $Al(CH_3)_3$ (the Al precursor) and $H_2O$ (the oxygen precursor) in a carrier $N_2$ gas flow.

Source and drain regions 150, 160 are selectively implanted through the 30 nm thick $Al_2O_3$ layer, e.g., with a Si dose of $1 \times 10^{14}$ cm$^{-2}$ at 140 keV. Implantation activation may be achieved by rapid thermal anneal (RTA), e.g., at 720° C. for 10 seconds. Regrown oxide may be etched away using BHF. A thin layer of $Al_2O_3$ or $HfO_2$ or HfAlO (e.g., 8 nm) is deposited, and a post deposition anneal is performed. Those of skill in the art are familiar with suitable alternative materials and process parameters for surface preparation and implantation and activation of source and drain regions.

The source and drain ohmic contacts may be defined by an electron beam evaporation of a combination of AuGe/Pt/Au and a lift-off process, followed by a RTA process at 500° C. for 30 seconds, also in an $N_2$ ambient.

The gate electrode may be defined by electron beam evaporation of conductive materials, such as Ni/Au, Ti/Au, AuGe/Ni/Au, and/or AuGe/Pt/Au and a lift-off process.

Referring now to FIGS. 2D-2J, data for an enhancement-mode n-channel InP MOSFET fabricated on a semi-insulating substrate with (ALD) $Al_2O_3$ as the gate dielectric are shown. The results illustrated in FIGS. 2D-2J are for MOSFETs with nominal gate lengths varying from 0.75 µm to 40 µm and a gate width of 100 µm. Transfer-length-method (TLM) structures are used to determine contact resistance of 2.5 ohm-millimeter (Ω·mm) and sheet resistance of 230 Ω/sq. at the implanted area. Measurements are made with standard equipment such as an HP4284 LCR meter for the capacitance measurement and a Keithley 4200 for measurement of the MOSFET output characteristics.

Figure 2D:
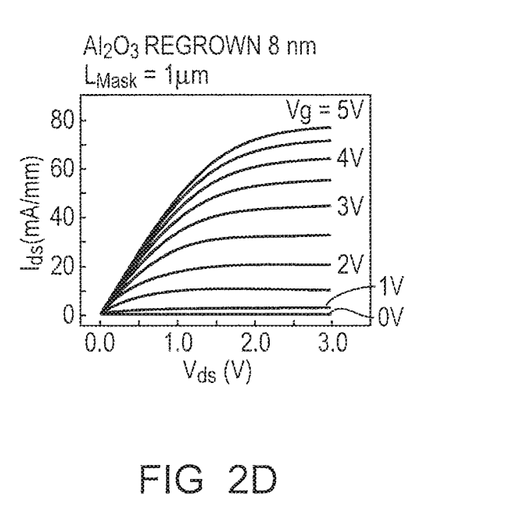

FIG. 2D illustrates the drain current vs. drain bias as a function of gate bias for a 1 µm InP MOSFET with 8 nm regrown $Al_2O_3$ as gate dielectric. In particular, the figure illustrates the dc $I_{ds}$-$V_{ds}$ characteristic with a gate bias from 0 to 8 V. The measured MOSFET has a designed gate length at mask level ($L_{Mask}$) of 0.75 µm and a gate width ($L_w$) of 100 µm. A maximum drain current of 70 mA/mm is obtained at a gate bias of 8 V and a drain bias of 3 V. The gate leakage current is below 10 µA/mm under the same bias condition, more than 4 orders of magnitude smaller than the drain on-current. A maximum transconductance $g_m$ is approximately 10 millisiemens/mm (mS/mm) and an output conductance of approximately 3 mS/mm (Vg=8 V). The relatively low $g_m$ may be improved by reducing the thickness of the dielectric, increasing the dielectric constant, and improving the quality of the interface.

Figure 2E:
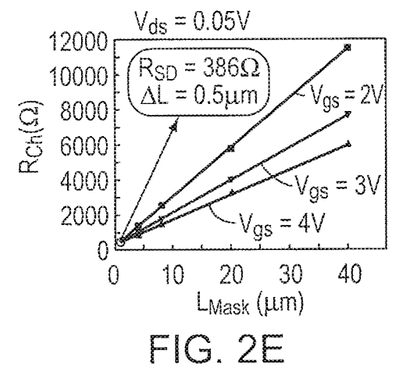

Since the fabrication process used in some embodiments is not self-aligned, accurate determination of the effective gate length and series resistance is especially important for evaluating the intrinsic device performance and the potential for further optimization. FIG. 2E illustrates measured channel resistance vs. mask gate length for different gate biases with $Al_2O_3$ thickness of 30 nm. Specifically. FIG. 2E shows the effective gate length $L_{eff}$ and series resistance ($R_{SD}$) extracted by plotting channel resistance $R_{Ch}$ vs. $L_{Mask}$. $R_{SD}$ and ΔL, which is the difference between $L_{Mask}$ and $L_{eff}$, are determined to be 38.6 Ω·mm and 0.5 µm, respectively, by the equation below:

$$\frac{V_{ds}}{I_d} = R_{Ch} = \frac{L_{eff}}{W\mu_{eff}C_G(V_{GS} - V_T)} = \frac{L_{mask} - \Delta L}{W\mu_{eff}C_G(V_{GS} - V_T)} \quad (1)$$

The effective electron mobility $\mu_{eff}$ is weakly dependent on gate bias from 2-4 V and is taken as a constant in this calculation. $R_{SD}$ and $L_{eff}$ is determined as the intercept of the linear fitting of $R_{Ch}$ at different gate biases and $L_{Mask}$ as shown in FIG. 2E. The $R_{SD}$ value of 386Ω and the ΔL value of 0.5 µm were determined using line fitting. The obtained $R_{SD}$ is consistent with the results from measurement by a TLM technique since $R_{SD}$ includes contact resistance, sheet resistance, accumulation resistance and spread resistance. ΔL is caused by the inter-diffusion of source and drain implant activation and the proximity effect of the photolithography process.

Figure 2F:
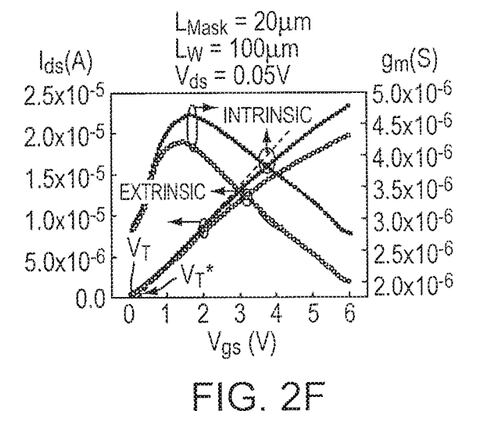

FIG. 2F illustrates extrinsic and intrinsic drain current and trans-conductance vs. gate bias. In particular, to evaluate the output characteristics more accurately, the intrinsic transfer characteristics is calculated by subtracting the series resistance $R_{SD}$ and using effective gate length $L_{eff}$ instead of mask gate length $L_{Mask}$ and compared with the extrinsic one, as shown in FIG. 2F. The intrinsic drain current and transconductance are only about 10% larger than the extrinsic ones due to the large gate length of 20 µm. FIG. 2F also shows that the subthreshold characteristic is scarcely changed. However, the threshold voltage determined by conventional method of linear region extrapolation does show some difference as highlighted as extrinsic threshold voltage $V_T$ and intrinsic threshold voltage $V_T^*$ in FIG. 2B.

Figure 2G:
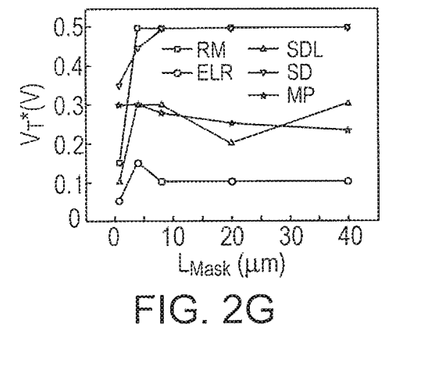

To better extract the threshold voltage, which is an important parameter in E-mode device characterization, several different methods are used to determine $V_T^*$ on various gate lengths as presented in FIG. 2G. FIG. 2G illustrates threshold voltage vs. the gate length using the intrinsic I-V characteristics of the device using five different methods—the ratio method (RM), the extrapolation in the linear region method (ELR), the second derivative method (SD), the second derivative logarithmic method (SDL), and the match-point method (MP). The figure shows that the linear method may not be appropriate for determine threshold voltage for a non-self-aligned process. The second derivative method and ratio method give mostly the same value at the long gate length and both show $V_T^*$ roll-off behavior for the submicron gate length device. These two methods may be more reliable ways to determine threshold voltage since the conducting mechanism changes during the transition near threshold, when drain current increases from exponentially to linear or quadratic dependence on the effective gate voltage ($V_g$-$V_T$).

Figure 2H:
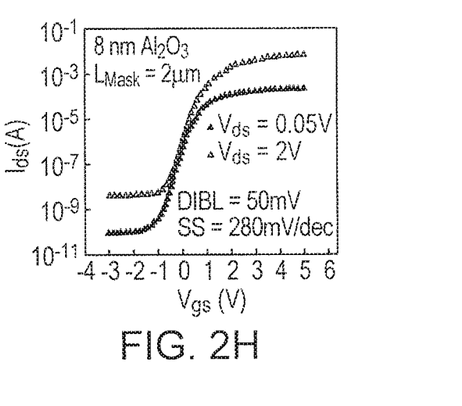

FIG. 2H illustrates drain current vs. drain bias as a function of gate bias for a 2 µm InP MOSFET with 8 nm $Al_2O_3$ gate oxide. In particular, the sub-threshold slope (S.S>) and DIBL characteristics of 280 mV/dec and 50 mV for the MOSFET are illustrated.

Figure 2I:
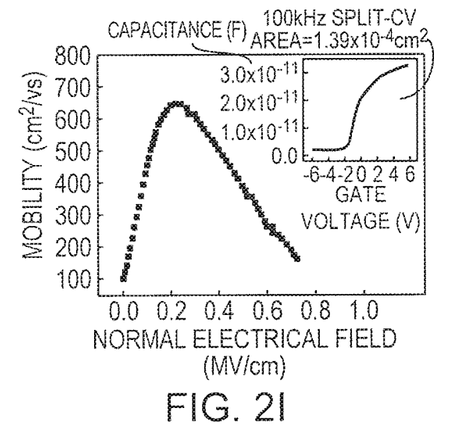

FIG. 2I illustrates effective mobility vs. normal electric field for the InP MOSFET with 30 nm $Al_2O_3$ gate oxide and a 100 kHz split-CV measurement. Effective mobility is another important parameter for evaluating MOSFET performance. The "Split-CV" method is used to measure the channel capacitance, which may be used to calculate the total inversion charge in the channel by integrating the C-V curve. The inset of FIG. 2I is a 100 kHz C-V curve between gate and channel measured on a 40 µm gate length device from which inversion capacitance is seen clearly. The extracted mobility has a peak value of 650 $cm^2$/Vs around a normal electric field of 0.22 MV/cm as shown in FIG. 2I. Better mobility performance may be achievable by using an epitaxial InP layer to improve host material quality and optimize the device fabrication process.

Figure 2J:
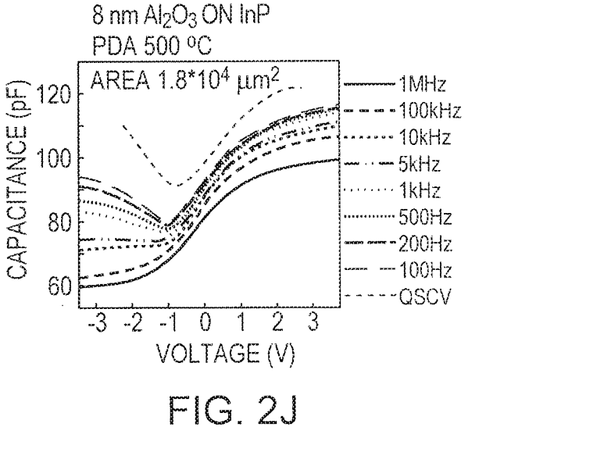

Detailed C-V measurements of MOS capacitors were carried out to evaluate the interface quality of $Al_2O_3$ formed by ALD on InP. FIG. 2J illustrates C-V measurements of an 8 nm $Al_2O_3$/n-InP MOSCAP from quasi-static up to 1 MHz.

Specifically, the samples include 8 nm thick $Al_2O_3$ deposited on an n-type InP substrate at 300° C. by ALD. A 500° C. post deposition annealing improves C-V characteristics only moderately for InP as shown in FIG. 2J, in contrast to the GaAs case. The frequency dispersion at accumulation capacitance may be attributed to the relative high interface trap density ($D_{it}$) at the conduction band edge, though the extrinsic parasitic effects could also contribute to the frequency dispersion partly. The mid-gap $D_{it}$ is estimated to be approximately 2-3×$10^{12}$/$cm^2$ eV determined by the high-frequency (HF)-low-frequency (LF) method. This value is consistent with the value determined from the m-factor, a parameter related to sub-threshold characteristics. More specifically, the subthreshold slope is relatively large due to the large gate oxide thickness or the small oxide capacitance $C_{ox}$ and the existing interface trap capacitance $C_{it}$. M-factor is defined as 60 mV/dec.×(1+$C_{it}/C_{ox}$). From the measured sub-threshold slope, an interface trap density $D_{it}$ of ~2-3× $10^{12}/cm^2$ eV is determined.

Moderate hysteresis of 100-300 mV exhibits in the C-V loops (not shown). The C-V characteristics in FIG. 2J show a clear transition from accumulation to depletion for HF C-V and the inversion features for LF C-V and quasi-static C-V indicating that the conventional Fermi-level pinning phenomenon reported in the literature is overcome in this ALD $Al_2O_3$/InP sample. The unpinning of the Fermi level may be attributed to the self-cleaning ALD $Al_2O_3$ process that removes the native oxide on the InP surface, similarly to the situation in ALD $Al_2O_3$ formed on GaAs. The unpinning of the Fermi level by the ALD Ab03 process described above is significant, as it contributes to the realization of enhancement-mode MOSFETs on InP, as demonstrated in FIG. 2D.

The ALD process on III-V compound semiconductors enables the formation of high-quality gate dielectrics and unpinning of the Fermi level on compound semiconductors. A 0.75-μm gate-length E-mode n-channel MOSFET with an $Al_2O_3$ gate oxide thickness of 30 nm may have a gate leakage current less than 10 μA/mm at a gate bias of 8 V, a maximum drain current of 70 mA/mm, and a transconductance of 10 mS/mm. The peak effective mobility is ~650 $cm^2$/Vs and the interface trap density of $Al_2O_3$/InP is estimated to be ~2-3×$10^{12}/cm^2$ eV.

The prototype measurements reflected in FIGS. 2D-2J reflect the use of $Al_2O_3$ as the gate dielectric. Alternatively other materials, such as Hf-based high-k materials, can be used for the gate dielectric. An exemplary process for formation of $HfO_2$ as a dielectric by using ALD is to use ALD precursors such as $HfCl_4$, TEMAHf or TDMAHf and oxygen precursors such as $H_2O$ or $O_3$. A typical $HfO_2$ ALD process is performed between 200-350° C. Surface cleaning and preparation is similar with use of materials such as HF, HCl, $NH_4OH$ and $(NH_4)_2S$.

For InP devices, such as the examples of FIGS. 2A-2J, the substrate may be a semi-insulating InP substrate or alternatively may be another material that supports an InP channel device. For example, a Si or SOI substrate can provide cost and manufacturing advantages because of the possibility of using large-scale wafers and the well-developed Si-based processing facilities.

InP-based devices may be integrated on Si substrates by the use of aspect ratio trapping (ART) techniques. Two exemplary approaches for such integration using ART techniques are illustrated in FIGS. 3A-3D. A detailed description of ART techniques may be found in U.S. patent application Ser. No. 11/728,032, incorporated herein in its entirety.

Figure 3A:
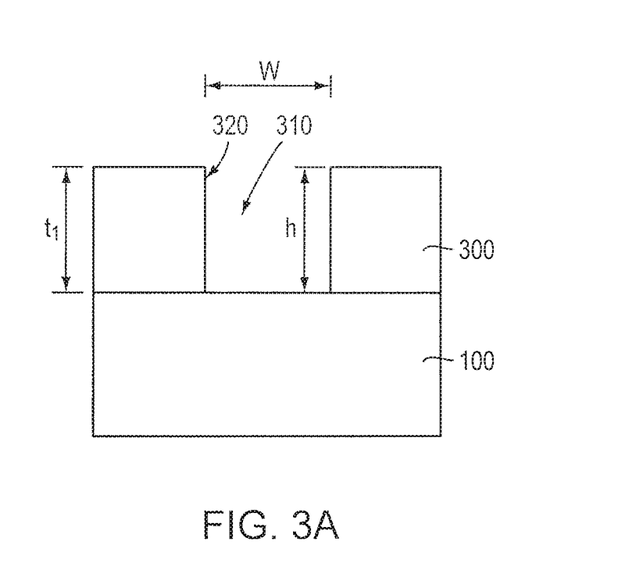
FIGS. 3A-3D are schematic cross-sectional views illustrating the fabrication of InP-based devices on lattice-mismatched substrates such as silicon, in accordance with an embodiment of the invention.
Figure 3B:
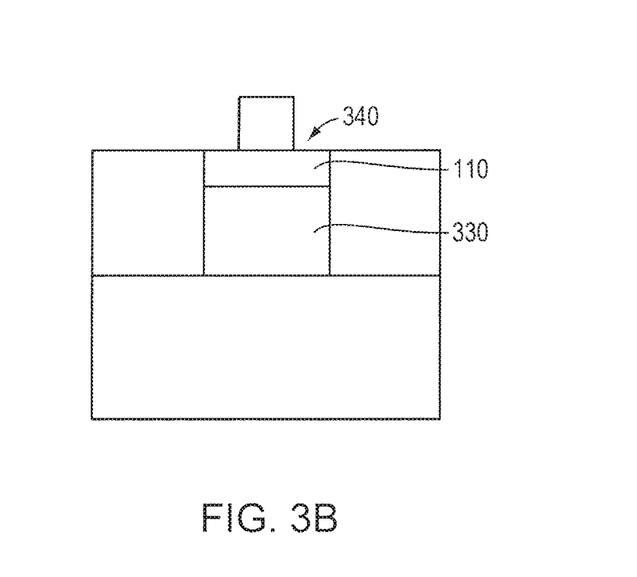

FIGS. 3A and 3B show how ART techniques may be used to grow a high-quality InP layer above a buffer layer on a lattice-mismatched underlying material, such as a Si wafer. The crystalline substrate may have a lattice constant substantially different from a lattice constant of InP. As illustrated in FIG. 3A, a non-crystalline material, e.g., a dielectric layer 300, is formed over the substrate 100. The dielectric layer 300 may include a dielectric material, such as silicon nitride or silicon dioxide. The dielectric layer 300 may be formed by a method known to one of skill in the art, e.g., thermal oxidation or plasma-enhanced chemical vapor deposition. As illustrated, the dielectric layer 300 has a thickness $t_1$ corresponding to a desired height of crystalline material to be deposited in a window 310 formed through the dielectric layer 300. In some embodiments, the thickness $t_1$ of the dielectric layer 300 is selected from a range of, e.g., 20-50000 nm.

A mask (not shown), such as a photoresist mask, is formed over the substrate 100 and the dielectric layer 300. The mask is patterned to expose at least a portion of the dielectric layer 300. The exposed portion of the dielectric layer 300 is removed by, e.g., reactive ion etching (RIE) to define the window 310 in the non-crystalline mask, i.e., in the dielectric layer 300. The window 310 extends to a surface of the substrate 100 and may be defined by at least one sidewall 320. The sidewall 320 is formed from the dielectric layer 300 and is, therefore, non-crystalline. The sidewall 320 may have a height h at least equal to a predetermined distance H from the surface of the substrate 100, i.e., the sidewall extends above the substrate by the height h. It has been observed experimentally that dislocations in a mismatched cubic semiconductor grown on a Si (100) surface in the near-vicinity (e.g., within approximately 500 nm or less) of a vertical dielectric sidewall 420 surface bend toward that surface at approximately 30 degrees through 60 degrees. For example, the dislocations may bend toward that surface at approximately a 45 degree angle to that surface. Based on this relationship, one may typically expect the predetermined distance H necessary to trap defects to be approximately equal to a width between w/2 and 2w, where w is the width of the window.

The window 310 may be substantially rectangular in terms of cross-sectional profile, a top view, or both, and have a width w that is smaller than a length l (not shown) of the window. For example, the width w of the window may be less than about 5000 nm, e.g., about 20-1000 nm. In some embodiments, the width of the window is about 150 nm. A length l of the window may exceed each of w and H. The ratio of the height h of the window to the width w of the window may be ≥1, and preferably is between about 1 and about 50.

A crystalline buffer layer 330 including a material, such as Ge or InP, that has a lattice mismatch with the substrate 100 material, e.g., Si, is epitaxially grown within the opening 310. By configuring the aspect ratio of the height of the mask relative to the width of the opening, defects arising from deposition of the buffer layer may exit at the sidewalls below the top surface of the mask layer. This provides a high-quality top surface of the buffer layer 330 upon which the InP-based top layer 110 may be grown epitaxially.

In particular, the buffer layer 330 may include a second crystalline semiconductor material that may include or consist essentially of a group IV element or compound, a III-V compound, and/or a II-VI compound. Examples of suitable group IV elements or compounds include germanium, silicon germanium, and silicon carbide. Examples of suitable III-V compounds include gallium arsenide, gallium nitride, indium arsenide, indium antimonide, indium aluminum antimonide, indium aluminum arsenide, indium phosphide, and indium gallium arsenide. Examples of suitable II-VI compounds include zinc selenide and zinc oxide. The buffer layer 330 is lattice-matched to the InP-based top layer 110 formed thereover, i.e., the buffer layer 330 may have a second lattice constant substantially similar to the lattice constant of InP.

The second crystalline semiconductor material may be formed by selective epitaxial growth in any suitable epitaxial deposition system, including, but not limited to, MOCVD, atmospheric-pressure CVD (APCVD), low- (or reduced-) pressure CVD (LPCVD), ultra-high-vacuum CVD (UHCVD), MBE, or ALD. In the CVD process, selective epitaxial growth typically includes introducing a source gas into the chamber. The source gas may include at least one precursor gas and a carrier gas, such as, for example, hydrogen. The reactor chamber may be heated by, for example, RF-heating. The growth temperature in the chamber may range from about 300° C. to about 900° C., depending on the composition of the epitaxial region. The growth system may also utilize low-energy plasma to enhance the layer growth kinetics. CVD has a number of advantages, including the capability for depositing films with low defect densities and rapidly varying alloy compositions, as well as high quality regrowth capability. CVD may also provide improved manufacturability due to relatively higher throughput, relatively short downtimes, and scalability to very large reactors.

The epitaxial growth system may be a single-wafer reactor or a multiple-wafer batch reactor. Suitable CVD systems commonly used for volume epitaxy in manufacturing applications include, for example, an Aixtron 2600 multi-wafer system available from Aixtron, based in Aachen, Germany; an EPI CENTURA single-wafer multi-chamber systems available from Applied Materials of Santa Clara, Calif.; or EPSILON single-wafer epitaxial reactors available from ASM International based in Bilthoven, The Netherlands.

Dislocation defects in the second crystalline semiconductor material reach and terminate at the sidewalls 320 of the window in the dielectric material 300 at or below a vertical predetermined distance H from the surface of the substrate, such that dislocations in the second crystalline semiconductor material decrease in density with increasing distance from the bottom portion of the window. Accordingly, the upper portion of the buffer layer 330 is substantially exhausted of dislocation defects. Various dislocation defects such as threading dislocations, stacking faults, twin boundaries, or anti-phase boundaries may thus be substantially eliminated from the upper portion of the epitaxial region. A density of such dislocation defects may be less than, for example, $10^6/cm^2$, preferably less than $10/cm^2$. The second crystalline semiconductor material may be either substantially relaxed or strained.

The InP-based top layer 110, i.e., the channel layer, is formed over the buffer layer 330, the channel layer being substantially lattice-matched with the buffer layer. After using ART techniques to provide a high-quality InP-based top layer 110, the techniques as described above in connection with FIGS. 1A, 1B, and 2A-2J may be used to create a device 340, such as a transistor, which incorporates the InP-based top layer, preferably as a channel. The source and drain regions of the transistor may also be formed in the channel layer, and a gate formed above the channel layer.

Although using a Si substrate provides cost and manufacturability advantages, ART techniques may be used with a variety of substrate and mask materials. As discussed in U.S. Ser. No. 11/728,032, the opening may be configured in a variety of ways based on materials and applications, such as in a trench configuration.

Figure 3C:
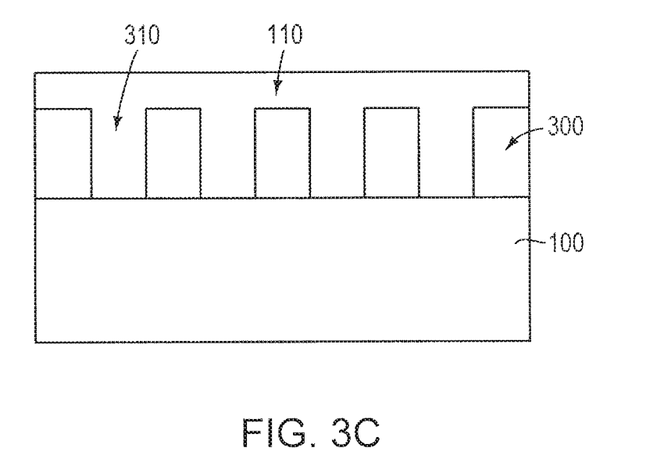
Figure 3D:
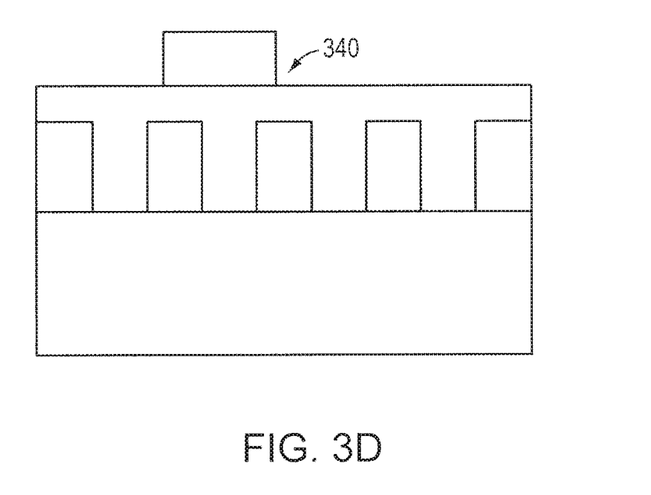

Referring now to FIGS. 3C and 3D an alternative ART approach for providing an InP-based channel layer is described. The mask 300 defines a plurality of openings 310 above substrate 100. An InP-based material, such as InP, is epitaxially grown within the openings, which are configured with an aspect ratio so that the majority of defects arising from the lattice mismatch between the underlying substrate, e.g., Si and InP, exit the InP-based layer at the mask sidewalls within the openings. The InP-based material is epitaxially grown to extend above the mask 300 to define a high quality coalesced InP-based top layer 110, upon which InP-based devices 340, such as the MOSFETs described above with reference to FIGS. 1A, 1B, and 2A-2J, may be fabricated.

Figure 4A:
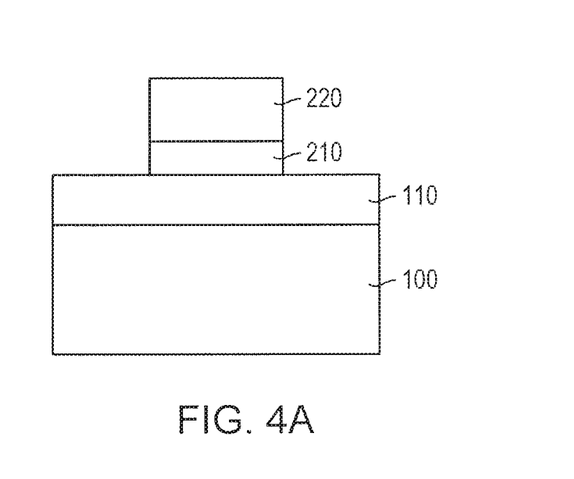
FIGS. 4A-4C are schematic cross sectional views illustrating fabrication of an enhancement-type InP MOSFET, in accordance with an embodiment of the invention.

Creation and activation of the source and drain may be a challenging step in forming transistors such as an inversion-type InP MOSFET. An alternative to the implanted source/drain formation approach discussed above uses a replacement source/drain structure. Referring to FIG. 4A, a semiconductor substrate 100 with an InP-based top channel layer 110 is provided, with predefined channel doping type and doping level. The channel may be, for example, p-type doped with a doping level of $1\times10^{18}/cm^3$ to $1\times10^{19}/cm^3$. For a III-V material such as InP, a suitable n-type dopant is a Group IV element, such as Si. A suitable p-type is a Group II element, such as Mg. A relatively high doping level is preferred for enabling the low contact resistances. It is a challenge, however, to dope InP and other III-V materials to a level greater than $1\times10^{20}/cm^3$.

A gate dielectric 210 is deposited on the InP channel material according to the methods described above, for example using ALD to deposit a dielectric material such as $Al_2O_3$. The dielectric material may include hafnium, e.g., $HfO_2$. Thereafter, a conductive layer, e.g., a gate electrode layer is formed over the gate dielectric, such that the dielectric layer is disposed between a semiconductor layer, i.e., the InP-based top channel layer 110, and the conductive layer. A gate 220 is defined in the conductive layer by patterning methods known to one of skill in the art.

Figure 4B:
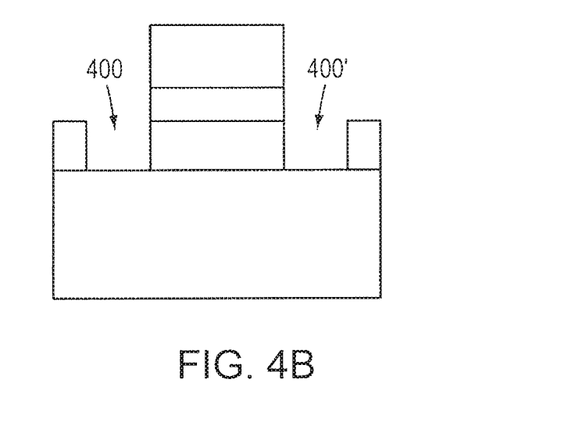
Figure 4C:
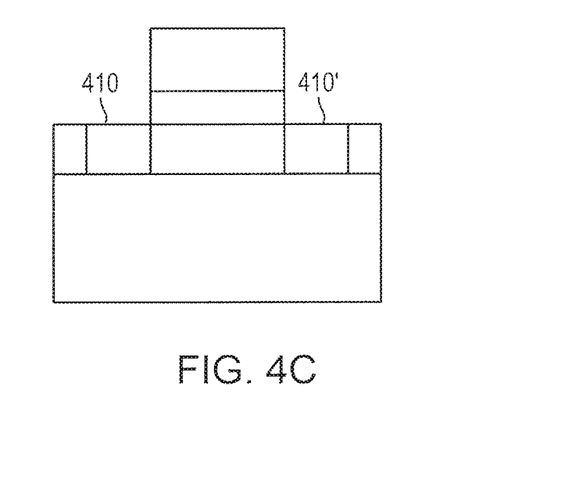

Using techniques known to those familiar with the art, a source region and a drain region are patterned in a lithographic mask next to the gate structure, and the portions of the InP-based top layer 110 in the source and drain regions are removed by, e.g., dry etching, to form source and drain recesses 400, 400', as shown in FIG. 4B. The source and drain recesses 400, 400' are filled with an appropriate source/drain material 410 that has a doping type opposite to that of the channel region, as shown in FIG. 4C. In an embodiment, InP may be grown epitaxially within the source and drain recesses 400, 400' by CVD with doping performed in situ. With a p-type channel dopant, an n-type dopant may be used for the source and drain to create an n-MOSFET. The doping types are reversed for a p-MOSFET. Those of skill in the art understand how to use appropriate dopants and materials to achieve the desired device characteristics.

This approach, including the regrowth of the source and drain in the recesses, may allow the achievement of higher doping concentrations in the source and drain regions, and may enable lower contact resistances. The MOSFET structure illustrated in FIG. 4C may be an inversion-type, enhancement-mode device. As discussed previously, at Vg=0, a pn-junction blockades the drain current in the channel so that the device is off. At Vg>0, the InP-based channel under the gate is inverted to become n-type, so the device is on with a large drain current.

Figure 5A:
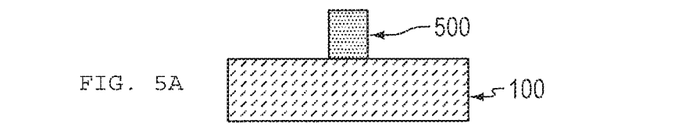
FIGS. 5A-5G are schematic cross-sectional views illustrating a method of making a self-aligned gate structure for an InP-based MOSFET, according to an embodiment of the invention.
Figure 5B:
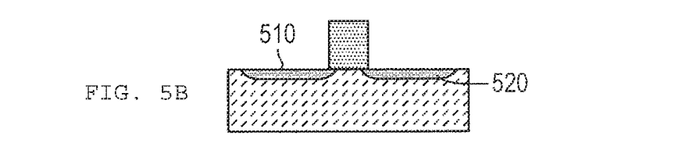
Figure 5C:
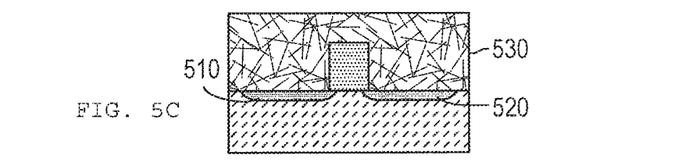
Figure 5D:
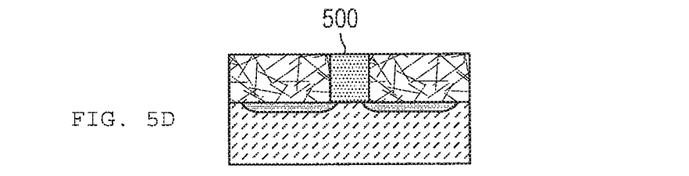
Figure 5E:
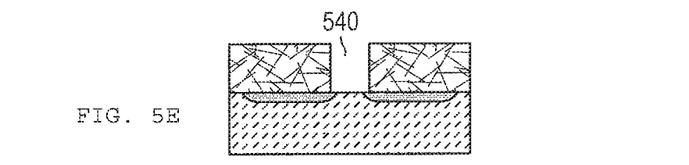
Figure 5F:
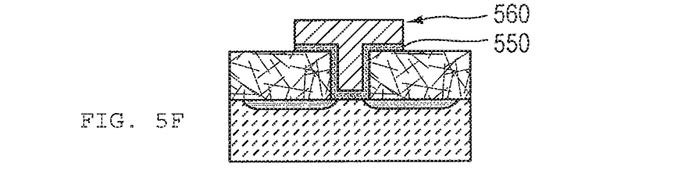
Figure 5G:
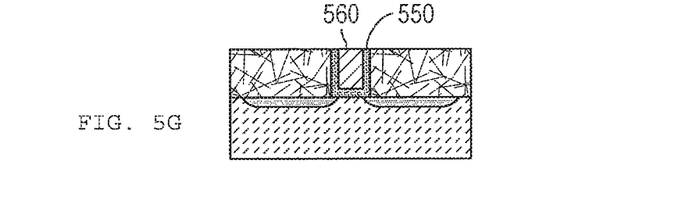

FIGS. 5A-5G illustrate a method of creating a MOSFET with source and drain regions that are self-aligned to the gate, i.e., the edges of the source and drain regions next to the gate are defined by the same mask that defines the edges of the gate next to the source and drain regions. Referring to FIG. 5A, a mask 500 defines the locations of the gate and channel locations over a substrate 100. The mask 500 functions as a dummy gate and also as a barrier to ion implantation in the channel region during creation of the source and drain regions 510, 520 by ion implantation, as shown in FIG. 5B. The mask may be made from an appropriate material, such as photoresist. After ion implantation of the source and drain regions, an insulator 530 such as SiN is deposited over the mask 500 and source and drain regions 510,520, and is then etched back to expose a top surface of the mask 500 (i.e., of the dummy gate) as shown in FIGS. 5C and 5D. Referring to FIG. 5E, the dummy gate is then removed by a selective etch, e.g., by a wet etch such as KOH or TMAH, or a dry etch in a reactive ion etching system, to define an opening 540. A gate dielectric 550 and gate material layers 560 are deposited into the opening created by the removal of the dummy gate, and etched back as shown in FIGS. 5F and 5G. Advantageously, this self-aligned gate procedure enables the use of InP as a channel material and ALD for depositing a high-k gate dielectric while maintaining small (sub-micron) feature sizes and spacing. Forming a dummy gate enables the formation of a self-aligned gate, without exposure of the device gate dielectric and gate electrode to a high temperature dopant activation process that may damage a high-k dielectric. The dummy gate approach includes forming a gate dielectric after a source/drain implantation and activation, rather than before these steps, as in a conventional process flow.

Figure 6A:
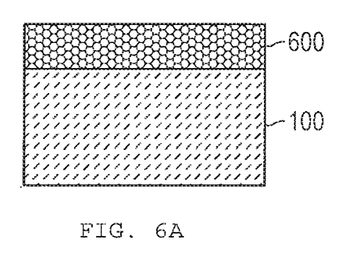
FIGS. 6A and 6B are schematic cross-sectional views illustrating dielectric layers deposited on an InP substrate.
Figure 6B:
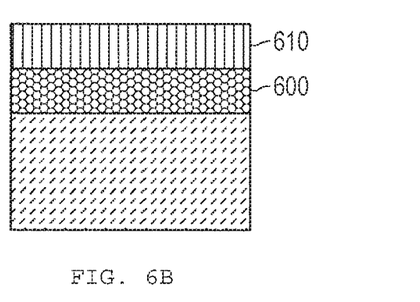

InP is a binary compound semiconductor resulting from a relatively weak covalent bond between indium and phosphorous. While InP MOSFETs feature characteristics such as enhanced drain currents and improved performance with respect to Fermi-level pinning and higher electron saturation velocity, the relatively strong electropositivity of indium can be a disadvantage, resulting, for example, in the relatively high reactivity of InP with oxygen. Thus, for example, as shown in FIGS. 6A and 6B, to mitigate interfacial instability difficulties between InP and dielectric materials as well as to prevent incongruent sublimation of the III-V material InP, it is possible to use a diffusion/barrier layer 600 including a relatively inert materials such as transition metal nitrides or group III-nitrides (e.g., BN, AlN, MoN, TaN, TiN, or AlN, etc., which are much less reactive with InP than oxygen, especially at higher temperatures) adjacent the top surface of the InP-based top layer 110 of substrate 100. As shown in FIG. 6B, the use of a relatively inert diffusion/barrier layer 600 permits the sequential deposition of a relatively non-inert dielectric 610 such as $SiO_2$ or $Al_2O_3$ above the relatively inert layer. By use of ALD, the inert barrier layer 600 may be kept relatively thin, e.g., as thin as one monolayer (which typically will be about 15 angstroms (Å)), or preferably about 5 to 10 nanometers (nm), although the barrier layer can be substantially thicker, e.g., as thick as 1 μm or more. In alternative embodiments, the barrier layer may be AlN or AlON or a nanolaminate—e.g., alternating layers of AlN and $Al_2O_3$, deposited as monolayers or in layers of about 5 nm—which can enhance the ability of the barrier layer to trap materials such as In or P before they can diffuse through the barrier layer.

Figures 7A, 7C:
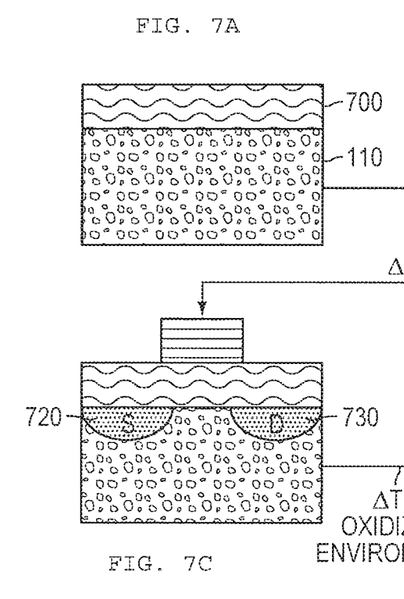
FIGS. 7A-7D are schematic cross sectional views illustrating a method of implantation and amorphization of source and drain regions through a diffusion/barrier layer and subsequent recrystallization of the source and drain regions and oxidation to improve the layer's dielectric properties.
Figure 7B:
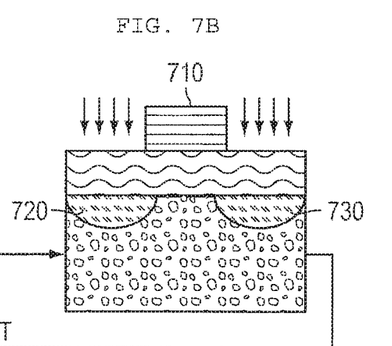
Figure 7D:
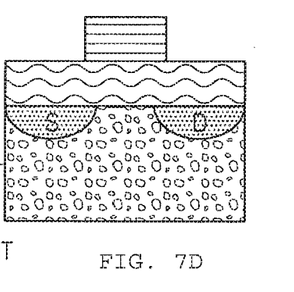

FIGS. 7A-7D illustrate a method of forming source and drain regions that also provides for an improved dielectric layer, e.g., an improved gate dielectric layer. In FIG. 7A a dielectric 700 inert to InP, such as a transition metal-nitride, is provided above an InP-based top layer 110 using ALD as described above for FIGS. 6A and 6B. In FIG. 7B the gate 710 is defined and the source and drain regions 720, 730 of a transistor are implanted using techniques similar to those discussed above for FIGS. 1A, 1B, and 2A-2J, and the source and drain regions are amorphized. In an embodiment, amorphization is accomplished by using a heavy dopant species such as $SiF_x$, with sufficient dopant dosage and energy to concomitantly accomplish both amorphization and high dopant concentration of the source/drain regions. In another embodiment, amorphization is accomplished by implanting an inert element such as argon or another suitable noble gas prior to the implantation of the dopant species. In still another embodiment, amorphization is accomplished by using a heavy dopant species such as $SiF_x$, with sufficient dopant dosage and energy to concomitantly accomplish amorphization of and high dopant concentration in the source/drain regions. For example, complete amorphization of the InP lattice may be accomplished through the use of high dosage implants using compounds such as $SiF_x$ between $10^{14}$ cm$^{-2}$ and $10^{16}$ cm$^{-2}$ through dielectric layer(s). Easy displacement of the In sublattice along <0001> directions can enable amorphization through heavy dosage implantation.

In FIG. 7C the source/drain regions 720, 730 are annealed at a temperature sufficiently high to ensure recrystallization, such as by RTA between 400° C. and 1000° C. Use of high implantation dosages and improved activation/ionization of the dopant species through recrystallization of the amorphized InP lattice lowers the contact resistance. Then in FIG. 7D an oxidizing species, e.g., PECVD $SiO_2$, is introduced at a temperature of, e.g., 300° C., to enable formation of an oxynitride from the dielectric 700, e.g., from a dielectric transition metal nitride. Converting the dielectric transition metal nitride into an oxynitride provides an improved dielectric from the same layer that provided an effective diffusion barrier, eliminating the need to deposit new dielectric material. Effective performance of the transistor embodiment of FIGS. 7A-7D is enhanced by the use of ohmic contacts.

In some embodiments, processes and materials analogous to the methods described above may be used to form a high electron mobility transistor (HEMT) including an InP-based material. A HEMT is a field effect transistor incorporating a junction between two materials with different band gaps (i.e., a heterojunction) as the channel instead of a doped region. An InP-based material may be incorporated in a HEMT as a portion of the channel layer.

The embodiments disclosed above and their variations address a variety of challenges in providing enhanced MOSFET performance in a commercially viable way through various combinations of materials and techniques such as InP-based, ALD, and $Al_2O_3$ or Hf-based dielectrics in conjunction with various other features and steps. Those skilled in the art will understand how to substitute other materials and process steps to apply these inventive combinations to a variety of applications.

What is claimed is:
1. A method comprising:
    forming a mask layer over a substrate, the substrate comprising a first crystalline semiconductor material having a first lattice constant, the mask layer comprising a non-crystalline dielectric material;
    patterning the mask layer to form an opening in the mask layer, the opening exposing a portion of the substrate;
    forming a buffer layer in the opening, the buffer layer comprising a second crystalline semiconductor material having a second lattice constant, the second lattice constant being different from the first lattice constant, a topmost surface of the buffer layer being below a topmost surface of the mask layer, dislocation defects within the buffer layer extending laterally and terminating at a sidewall of the opening;
    forming a semiconductor layer over the buffer layer in the opening, the semiconductor layer fully filling the opening, the semiconductor layer being made of a single third crystalline semiconductor material having a third lattice constant, the third lattice constant being substantially same as the second lattice constant; and forming a gate stack over the semiconductor layer, wherein the topmost surface of the mask layer is level with a topmost surface of the semiconductor layer after forming the gate stack.

2. The method of claim 1, wherein the mask layer has a thickness between about 20 nm and about 50000 nm.

3. The method of claim 1, wherein a height of the opening is greater than or equal to a first height, and wherein the first height is between one half of a width of the opening and two times the width of the opening.

4. The method of claim 1, wherein a ratio of a height of the opening to a width of the opening is between about 1 and about 50.

5. The method of claim 1, wherein forming the buffer layer in the opening comprises selectively epitaxially growing the buffer layer in the opening.

6. The method of claim 1, wherein a density of the dislocation defects within the buffer layer decreases with increasing a distance from a bottom of the opening.

7. The method of claim 1, wherein the semiconductor layer is made of InP.

8. A method comprising:
forming a non-crystalline dielectric layer over a substrate, the substrate comprising a first crystalline semiconductor material having a first lattice constant;
etching the non-crystalline dielectric layer to form an opening in the non-crystalline dielectric layer, the opening exposing a portion of the substrate, the opening having a first width and a first height;
epitaxially growing a buffer layer in the opening, the buffer layer comprising a second crystalline semiconductor material having a second lattice constant, the second lattice constant being different from the first lattice constant, the buffer layer having a second height less than the first height, dislocation defects within the buffer layer extending laterally and terminating at a sidewall of the opening below a third height, the third height being less than the second height, the third height being between one half of the first width and two times the first width;
epitaxially growing a semiconductor layer over the buffer layer in the opening, a topmost surface of the semiconductor layer being level with a topmost surface of the non-crystalline dielectric layer, the semiconductor layer being made of a single third crystalline semiconductor material having a third lattice constant, the third lattice constant being substantially same as the second lattice constant;
forming a gate dielectric over the semiconductor layer; and
forming a gate electrode over the gate dielectric, wherein a topmost surface of the buffer layer is below with the topmost surface of the non-crystalline dielectric layer after forming the gate electrode.

9. The method of claim 8, wherein the second crystalline semiconductor material is different from the third crystalline semiconductor material.

10. The method of claim 8, further comprising:
etching the semiconductor layer to form a recess in the semiconductor layer; and
epitaxially growing a fourth crystalline semiconductor material in the recess.

11. The method of claim 8, wherein a ratio of the first height to the first width is between about 1 and about 50.

12. The method of claim 8, wherein the first width is between about 20 nm and about 1000 nm.

13. The method of claim 8, wherein the semiconductor layer is made of InP.

14. A method comprising:
forming a non-crystalline dielectric layer over a crystalline Si layer;
etching the non-crystalline dielectric layer to form an opening in the non-crystalline dielectric layer, the opening exposing a topmost surface of the crystalline Si layer, the opening having a first width and a first height;
epitaxially growing a buffer layer in the opening, the buffer layer comprising a crystalline semiconductor material having a lattice constant different from a lattice constant of crystalline Si, the buffer layer having a second height less than the first height, dislocation defects within the buffer layer extending laterally and terminating at a sidewall of the opening below a third height, the third height being less than the second height, the third height being between one half of the first width and two times the first width;
epitaxially growing a crystalline InP layer over and in physical contact with the buffer layer in the opening, a topmost surface of the crystalline InP layer being level with a topmost surface of the non-crystalline dielectric layer, the lattice constant of the buffer layer being substantially same as a lattice constant of crystalline InP; and
forming a gate stack over and in physical contact with the topmost surface of the crystalline InP layer, wherein the topmost surface of the crystalline InP layer remains level with the topmost surface of the non-crystalline dielectric layer after forming a gate stack.

15. The method of claim 14, wherein the topmost surface of the crystalline Si layer is a (100) surface.

16. The method of claim 14, wherein a length of the opening is greater than the first width of the opening.

17. The method of claim 14, wherein a length of the opening is greater than the third height.

18. The method of claim 14, wherein the first height is greater than the first width.

19. The method of claim 14, wherein a density of the dislocation defects within the buffer layer decreases with increasing a distance from a bottom of the opening.

20. The method of claim 14, wherein the non-crystalline dielectric layer comprises silicon nitride or silicon dioxide.

* * * * *